(12) United States Patent
Carpenter et al.

(10) Patent No.: US 7,378,127 B2
(45) Date of Patent: May 27, 2008

(54) CHEMICAL VAPOR DEPOSITION METHODS

(75) Inventors: Craig M. Carpenter, Boise, ID (US); Ross S. Dando, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 591 days.

(21) Appl. No.: 09/805,620

(22) Filed: Mar. 13, 2001

(65) Prior Publication Data

US 2004/0083959 A1  May 6, 2004

(51) Int. Cl.
*C23C 16/00* (2006.01)
(52) U.S. Cl. .................................. 427/248.1
(58) Field of Classification Search ............. 427/248.1
See application file for complete search history.

(56) References Cited

U.S. PATENT DOCUMENTS

| | | |
|---|---|---|
| 4,217,375 A | 8/1980 | Adams |
| 4,392,915 A | 7/1983 | Zajac |
| 4,444,812 A | 4/1984 | Gutsche |
| 4,513,021 A | 4/1985 | Purdes et al. |
| 4,537,795 A | 8/1985 | Nath et al. |
| 4,545,327 A | 10/1985 | Campbell et al. |
| 4,633,809 A | 1/1987 | Hirose et al. |
| 4,640,221 A | 2/1987 | Barbee et al. |
| 4,716,852 A | 1/1988 | Tsujii et al. |
| 4,738,748 A | 4/1988 | Kisa |
| 4,910,043 A | 3/1990 | Freeman et al. |
| 5,275,976 A | 1/1994 | Moslehi |
| 5,304,279 A | 4/1994 | Coultas et al. |
| 5,338,363 A | 8/1994 | Kawata et al. |
| 5,356,120 A | 10/1994 | Konig et al. |
| 5,366,585 A | 11/1994 | Robertson et al. |

(Continued)

FOREIGN PATENT DOCUMENTS

JP    20-46723    2/1990

(Continued)

OTHER PUBLICATIONS

U.S. Appl. No. 10/150,388, filed May 2002, Mardian et al (as filed and amended Oct. 7, 2003).

(Continued)

*Primary Examiner*—Timothy Meeks
*Assistant Examiner*—Kelly M Stouffer
(74) *Attorney, Agent, or Firm*—Wells St. John P.S.

(57) ABSTRACT

A chemical vapor deposition apparatus includes a deposition chamber defined at least in part by chamber walls, a substrate holder inside the chamber, and at least one process chemical inlet to the chamber. At least one purge inlet to the chamber is positioned elevationally above the substrate holder and outside a lateral periphery of the substrate holder. The purge inlet is configured to inject at least one purge material into the chamber and past the substrate holder. The purge inlet can be positioned and configured to inject an annular purge material curtain concentric to the substrate holder. A chemical vapor deposition method includes injecting at least one purge material into a deposition chamber and forming a purge curtain from the injected purge material. The purge curtain can extend downward from elevationally above a substrate holder and outside a lateral periphery of the substrate holder. The purge curtain can flow past the substrate holder.

10 Claims, 6 Drawing Sheets

U.S. PATENT DOCUMENTS

| | | | |
|---|---|---|---|
| 5,453,124 A | 9/1995 | Moslehi et al. | |
| 5,468,298 A | 11/1995 | Lei et al. | |
| 5,500,256 A | 3/1996 | Watabe | |
| 5,532,190 A | 7/1996 | Goodyear et al. | |
| 5,556,474 A | 9/1996 | Otani et al. | |
| 5,590,387 A | 12/1996 | Schmidt et al. | |
| 5,618,349 A | 4/1997 | Yuuki | |
| 5,647,912 A | 7/1997 | Kaminishizono et al. | |
| 5,674,574 A | 10/1997 | Atwell et al. | |
| 5,746,834 A | 5/1998 | Hanley | |
| 5,755,886 A * | 5/1998 | Wang et al. | 118/715 |
| 5,792,272 A | 8/1998 | van Os et al. | |
| 5,824,158 A | 10/1998 | Takeuchi et al. | |
| 5,827,370 A | 10/1998 | Gu | |
| 5,851,294 A | 12/1998 | Young et al. | |
| 5,884,009 A * | 3/1999 | Okase | 392/418 |
| 5,885,751 A | 3/1999 | Weidman et al. | |
| 5,972,430 A * | 10/1999 | DiMeo et al. | 427/255.32 |
| 5,983,906 A | 11/1999 | Zhao et al. | |
| 6,050,506 A | 4/2000 | Guo et al. | |
| 6,059,885 A * | 5/2000 | Ohashi et al. | 118/730 |
| 6,085,690 A | 7/2000 | Mizuno | |
| 6,113,078 A | 9/2000 | Rock | |
| 6,114,227 A | 9/2000 | Leksell et al. | |
| 6,132,512 A | 10/2000 | Horie et al. | |
| 6,187,101 B1 | 2/2001 | Yoshizawa | |
| 6,197,119 B1 | 3/2001 | Dozoretz et al. | |
| 6,200,893 B1 | 3/2001 | Sneh | |
| 6,305,314 B1 * | 10/2001 | Sneh et al. | 118/723 R |
| 6,312,526 B1 * | 11/2001 | Yamamuka et al. | 118/720 |
| 6,344,151 B1 | 2/2002 | Chen et al. | |
| 6,426,307 B2 | 7/2002 | Lim | |
| 6,444,039 B1 | 9/2002 | Nguyen | |
| 6,503,330 B1 | 1/2003 | Sneh et al. | |
| 6,579,372 B2 | 6/2003 | Park | |
| 6,638,880 B2 | 10/2003 | Yamamuka et al. | |
| 6,730,613 B1 | 5/2004 | Hwang et al. | |
| 6,890,596 B2 | 5/2005 | Sarigiannis et al. | |
| 2002/0157611 A1 * | 10/2002 | Bondestam et al. | 118/725 |
| 2004/0216671 A1 | 11/2004 | Carpenter et al. | |

FOREIGN PATENT DOCUMENTS

| | | |
|---|---|---|
| JP | 2002-371361 | 12/2002 |
| JP | 2002371361 A1 | 12/2002 |

OTHER PUBLICATIONS

U.S. Appl. No. 10/150,388, filed May 2002, Mardian et al (as amended Jun. 14, 2004 & Sep. 29, 2004).

* cited by examiner

FIG. 13

CHEMICAL VAPOR DEPOSITION METHODS

TECHNICAL FIELD

The present invention pertains to chemical vapor deposition apparatuses and purging devices in such apparatuses as well as deposition methods and methods that provide purging during deposition.

BACKGROUND OF THE INVENTION

Chemical vapor deposition (CVD) methods, such as, atomic layer deposition (ALD) methods, are often used in semiconductor processing and other industrial applications to form thin layers of materials. One consideration in selecting a deposition method is the process time to form a desired layer. Further, the quality of a product produced by a deposition method can be important. Along with an increasing need to reduce processing costs, a related desire exists to reduce process time while improving or maintaining product quality.

Speaking generally of ALD, a substrate is exposed to a first precursor material that is chemisorbed onto the substrate. The first precursor material is purged from the deposition chamber and a second precursor is chemisorbed onto the first precursor material on the substrate. Theoretically, the chemisorption of each precursor material is self limiting and the deposited material is formed one monolayer (1 atom thick) at a time. In practice, the ideal theoretical deposition is often not achieved or may be intentionally altered.

One potential cause for a deviation from ideal conditions is the simultaneous presence of the first precursor and the second precursor somewhere in a deposition apparatus other than on the substrate. For example, failure to completely purge one of the precursors from a deposition chamber may cause unwanted deposition on chamber components when the other precursor is introduced. Unwanted mixing of precursors can be a leading cause of particulate formation and product contamination in ALD.

Accordingly, the need to improve product quality and minimize down time for cleaning provides a motivation for careful purging practices. Unfortunately, carefully purging increases process time and accompanying process costs.

BRIEF DESCRIPTION OF THE DRAWINGS

Preferred embodiments of the invention are described below with reference to the following accompanying drawings.

SUMMARY OF THE INVENTION

According to one aspect of the invention, a chemical vapor deposition (CVD) apparatus can include a deposition chamber defined at least in part by chamber walls, a substrate holder inside the chamber, and at least one process chemical inlet to the chamber positioned over the substrate holder. At least one purge inlet to the chamber can be included and positioned elevationally above the substrate holder and outside a lateral periphery of the substrate holder. The purge inlet can be configured to inject at least one purge material into the chamber and past the substrate holder. As an example, the purge inlet can be comprised by at least one of the chamber walls at a point of entry from the purge inlet into the chamber. Also, the purge inlet can be positioned and configured to inject a purge material curtain concentric to the substrate holder. Accordingly, the at least one purge inlet can include a plurality of inlets.

In another aspect of the invention, a CVD apparatus can include a deposition chamber wherein one of the chamber walls is a lid having an outer surface outside the chamber and an inner surface inside the chamber. The apparatus can further include a substrate holder inside the chamber, at least one process chemical inlet to the chamber positioned over the substrate holder, and at least one purge passageway through the lid from the outer surface to the inner surface. The purge passageway can be separate from the process chemical inlet and can be configured to inject at least one purge material into the chamber and along at least a portion of the chamber walls. For example, the chamber, substrate holder, and purge passageway, can have relative positions and geometries configured to direct less than a substantial amount of purge material to a substrate received by the holder. The apparatus can further include a flow director inside the chamber laterally between the purge passageway and the process chemical inlet. A flow director can include a wall concentric to the substrate holder. The purge passageway can include at least one entry port through the outer surface into an enclosed channel laterally around the process chemical inlet. A plurality of exit ports can be provided from the enclosed channel through the inner surface. The enclosed channel can be annular.

In another aspect of the invention, a CVD method can include injecting at least one purge material into a deposition chamber and forming a purge curtain from the injected purge material. The purge curtain can extend downward from elevationally above a substrate holder and outside a lateral periphery of the holder to flow past the holder. The purge curtain can extend from one of the chamber walls that is a lid. The purge curtain can be concentric to the substrate holder and flow axially with respect to the holder. The purge curtain can also be annular. Preferably, the curtain is in a laminar, as opposed to turbulent, flow regime so as not to create any traps, eddies, etc. for process chemicals intended for removal.

According to another aspect of the invention, a deposition method can include injecting at least one deposition precursor into a deposition chamber defined at least in part by chamber walls. A first of the chamber walls can include a lid having an outer surface outside the chamber and an inner surface inside the chamber. The method can further include, while injecting the precursor, separately injecting a purge material through at least one purge passageway through the lid from the outer surface to the inner surface. The injected purge material can flow along at least a portion of the chamber walls. As an example, the method can further include forming a curtain from the injected purge material concentric to a second of the chamber walls, the curtain flowing axially with respect to the chamber. The method can further include forming an annular curtain from the injected purge material. Also, the injecting purge material can further include delivering the purge material through a dead space as to a precursor injected without the purge injection.

In a further aspect of the invention, a deposition method includes injecting at least one deposition precursor into a deposition chamber, the precursor delivery occurring through at least one process chemical port in a lid of the chamber. Delivery of the precursor can be ceased and a purge material delivered through at least one process chemical port. While delivering the purge material through the process chemical port, a purge material may be separately delivered through at least one purge port in the lid, the purge delivery occurring along the chamber walls. The method can further include not injecting the purge material through the purge port during the injecting the precursor through the process chemical port.

DETAILED DESCRIPTION OF THE PREFERRED EMBODIMENTS

This disclosure of the invention is submitted in furtherance of the constitutional purposes of the U.S. patent Laws "to promote the progress of science and useful arts" (Article 1, Section 8).

It is a disadvantage of current atomic layer deposition (ALD) chambers that dead spaces can exist along chamber walls and in other spaces of the chamber. In the context of the present document, "dead spaces" refers to spaces of stagnant flow as well as traps, eddies, and other flow-related effects that can delay direct passage of materials through a chamber. Process gases, such as gas or liquid precursors, reactants, carriers, purges, and other materials, can accumulate in the dead spaces and not be removed or motivate extensive purging in an effort to remove process chemicals from the dead spaces. Further, process chemicals accumulated in the dead spaces can react, forming particulates. Also, particulates formed in other parts of a deposition chamber can accumulate in the dead spaces and remain after purging the chamber. Once particulates form in the chamber, wafer contamination can result.

Accordingly, providing targeted purging to prevent process chemicals from migrating into dead space or purging through dead space can allow a decrease in purge time and/or decrease in contamination. Targeted purging can be performed during all of the pulse and purge cycles of ALD or only during selected parts of a pulse/purge cycle. For example, targeted purging might be performed only during the purge portion of a cycle or, alternatively, only during a pulse portion of a cycle. Notably, the various aspects of the invention described herein, are also applicable to non-ALD types of chemical vapor deposition (CVD). Targeted purging during CVD injection of multiple reactant species can isolate deposition away from chamber walls, dead space, and other spaces in a deposition chamber.

According to one aspect of the invention, a CVD apparatus can include a deposition chamber defined at least in part by chamber walls, a substrate holder inside the chamber, and at least one process chemical inlet to the chamber positioned over the substrate holder. The apparatus can further include at least one purge inlet to the chamber. The purge inlet can be positioned elevationally above the substrate holder and outside a lateral periphery of the substrate holder. The purge inlet can further be configured to inject at least one material into the chamber past the substrate holder.

Deposition chambers applicable to the present invention can have a variety of shapes and purposes. CVD includes various subvarieties of deposition processes including but not limited to ALD, plasma enhanced CVD, low pressure CVD, etc. Accordingly, a deposition chamber that may be benefited by the aspects of the invention described herein can posses a different structure compared to the exemplary chambers shown in the figures. Once the concepts of the invention described herein are understood, the specific structures shown as examples in the figures can be adapted to other deposition chambers. Similarly, a variety of substrate holders can be suitable for the various deposition chambers. A substrate holder can include a configuration arranged to receive only a single bulk semiconductor wafer. A substrate holder can also be configured to receive other substrates or to receive multiple wafers.

Given the variety of chambers and substrate holders, a variety of types and numbers of process chemical inlets can be used in the present invention. The exemplary figures described herein show a single process chemical inlet to a chamber for the sake of simplicity. However, a "shower head" arrangement of multiple inlets or other apparatuses for distributing process chemicals over a substrate can be suitable. In summary, any deposition chamber, substrate holder, or process chemical inlet known to those skilled in the art or later recognized can be a candidate for practicing the present invention by applying the concepts described herein.

As one example, the process chemical inlet can be positioned elevationally above the substrate holder and inside a lateral periphery of the substrate holder. The process chemical inlet can further be configured to inject at least one process chemical into the chamber and to a substrate received by the holder. Such a process chemical inlet can be contrasted to the purge inlet described above that is positioned elevationally above the holder as well, but outside a lateral periphery of the holder and configured to inject purge material past the holder. A purge inlet can be comprised by at least one of the chamber walls at a point of entry from the purge inlet into the chamber. Preferably, the purge inlet can be comprised at least in part by one of the chamber walls comprising a lid. A lid of a deposition chamber can merely be a top wall that is otherwise not separate or removable. Often, the lid is a separate and removable component of a chamber to allow maintenance of internal components. Accordingly, a lid can be attached to form one wall of a chamber by clamping, bolting, or any other acceptable method for a CVD apparatus. The lid could also be welded or an integral of other chamber walls, making in nonremovable.

The purge inlet to a chamber, whether part of a lid, part of a wall, or a component separate from chamber walls, can be positioned and configured to inject a purge material curtain concentric to the substrate holder. Further, the at least one purge inlet described above can include a plurality of inlets.

In another aspect of the invention, the deposition chamber can be defined in part by chamber walls, one of the chamber walls comprising a lid having an outer surface outside the chamber and an inner surface inside the chamber. The apparatus can further include at least one purge passageway through the lid from the outer surface to the inner surface. The purge passageway can be separate from process chemical inlets and configured to inject at least one purge material into the chamber and along at least a portion of the chamber walls. The chamber, a substrate holder, and the purge passageway can have relative positions and geometries configured to direct less than a substantial amount of purge material to a substrate received by the holder.

While a targeted purge as described herein can be advantageous, a desire can arise in certain applications to avoid interference of the targeted purge with simultaneous injection of other process chemicals. Accordingly, directing less than less than a substantial amount of purge material to a substrate can be particularly advantageous. Such a feature can be accomplished solely by a configuration and/or geometry of a purge passageway, solely by a separate flow director, by combination of purge passageway structure and a flow director, or by another feature in keeping with the concepts described herein.

A flow director can be provided inside the chamber laterally between the purge passageway and process chemical inlet. An exemplary flow director can include a wall concentric to the substrate holder. An exemplary purge passageway can include at least one entry port through the outer surface of the lid into an enclosed channel laterally around the process chemical inlet. The purge passageway can further include at least one exit port from the enclosed channel through the inner surface. The enclosed channel can be annular. Also, the exit port can be a plurality of about equally spaced exit ports forming a ring of exit ports around the holder. The exit ports can be positioned in a ring orifice formed in the lid.

Further, an intersection of the lid and a second of the chamber walls can form an interior corner of the chamber. A plurality of exit ports can be spaced apart from the corner. Alternatively, the at least one exit port can be positioned at the corner and defined in part by the second wall. Such exit port can be provided when the enclosed channel includes an annular channel having a plurality of enclosed radial channel extensions from the annular channel to one annular exit port defined in part by the second wall.

The passageway and its ports can further be configured to provide specialized purge scenarios. For example, the at least one purge passageway can include both a high pressure purge passageway and a separate low pressure purge passageway. The entry and exit ports from a purge passageway and other components of a passageway might be advantageously adapted to a high pressure purge in a different manner than adapted to a low pressure purge. In the context of the present document "high pressure" refers to a pressure at or above about 500 milliTorr while "low pressure" includes pressures below about 200 milliTorr.

Figure 1:
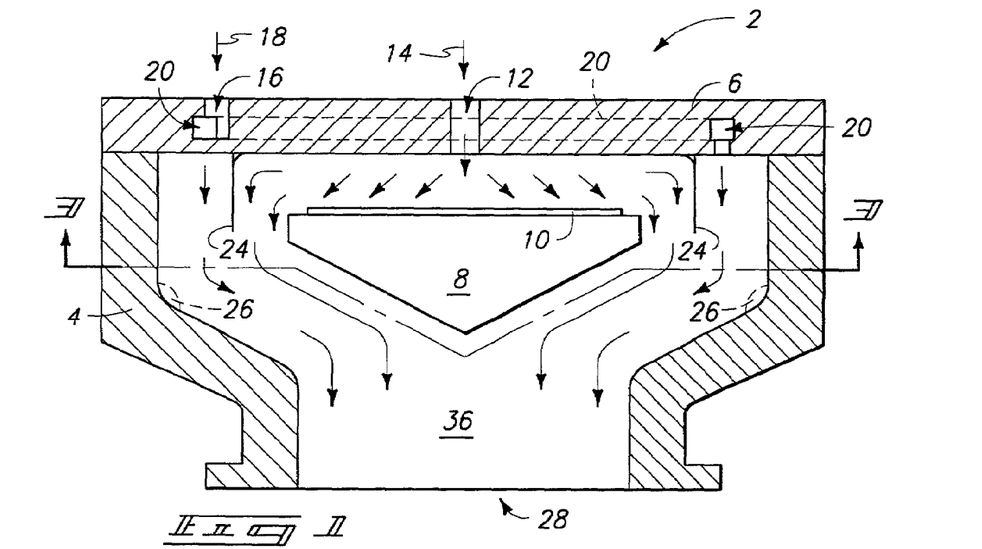
FIG. 1 shows a cross-sectional diagrammatic view of a deposition chamber portion according to an aspect of the invention.
Figure 2:
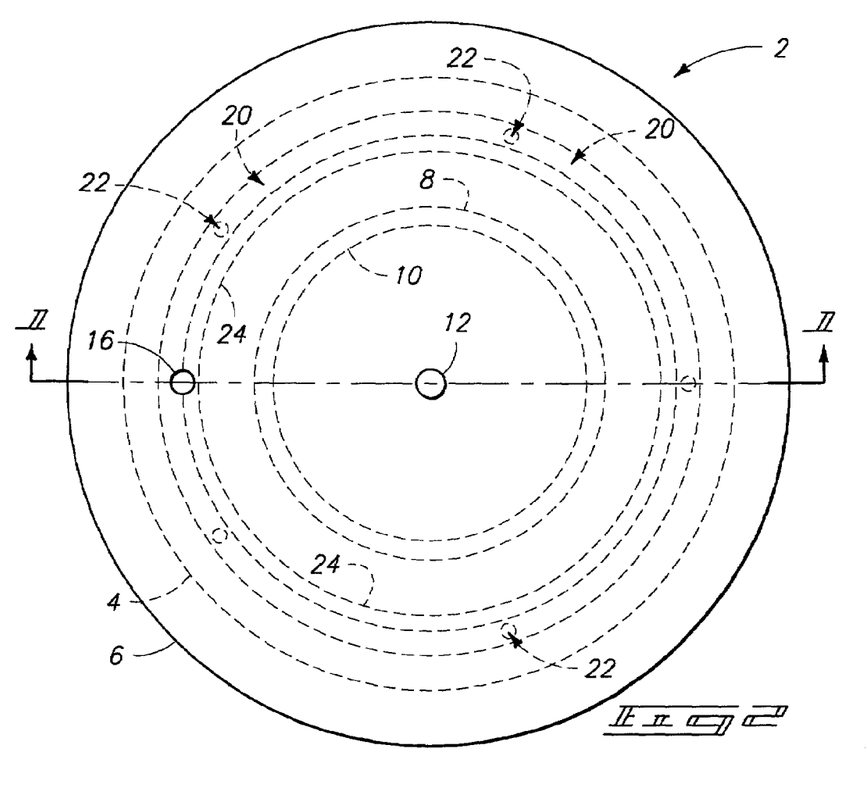
FIG. 2 shows a top view of the deposition chamber portion of FIG. 1.
Figure 3:
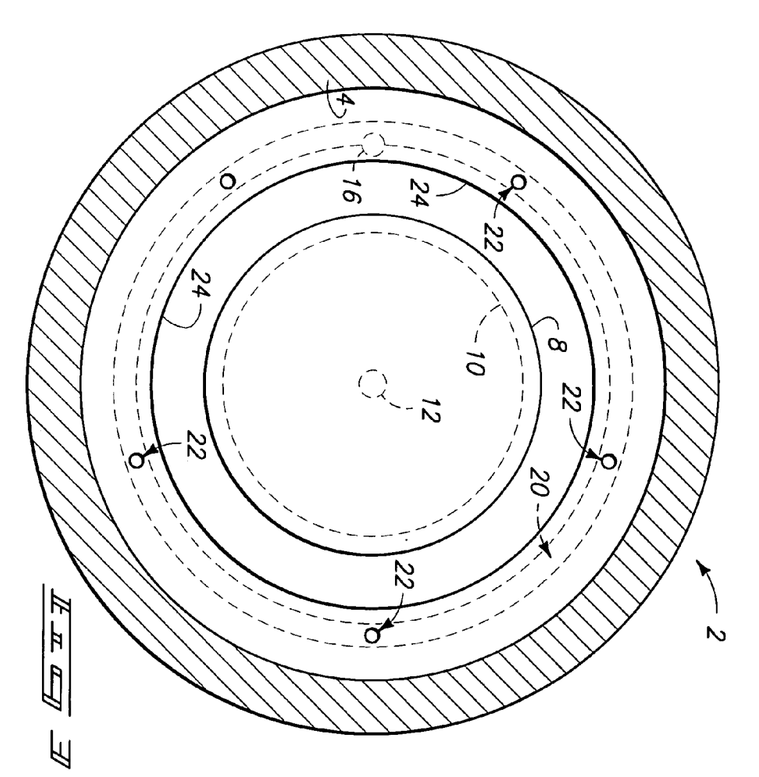
FIG. 3 shows a cross-sectional view of the deposition chamber portion in FIG. 1 taken along line 3-3.

Turning to FIGS. 1-3, a deposition chamber apparatus 2 is shown having a chamber body 4 and a chamber lid 6. Body 4 and lid 6 thus form chamber walls and at least in part define a chamber 36. A substrate chuck 8 is shown inside chamber apparatus 2 and a single bulk semiconductor wafer 10 is received on chuck 8. Process gases 14 are shown flowing through a process gas inlet 12 and into chamber 36. As indicated by flow lines in FIG. 1, process gas 14 is injected to wafer 10 on chuck 8 and continues in a flow path around chuck 8 and out a vacuum port 28. A variety of process gas distribution mechanisms may be suitable to accomplish the flow pattern shown in FIG. 1 but are not shown specifically in FIG. 1.

A purge gas 18 is shown flowing through a purge entry port 16 into an annular purge channel 20 positioned outside the lateral periphery of chuck 8. Purge gas 18 flows throughout purge channel 20 and enters chamber 36 through multiple purge exit ports 22. Purge gas 18 enters chamber 36 and proceeds in the indicated flow path along body 4 to vacuum port 28. Notably, a dead space 26 exists at a corner of body 4. Given the multiple purge exit ports 22 distributed around chuck 8, a curtain of purge gas can form between process gas 14 and body 4. Purge gas 18 can thus isolate process gas 14 away from body 4 and dead space 26. The flow rate of purge gas 18 might even be adjusted such that purge gas 18 flows through dead space 26.

An optional flow director 24 is shown extending from lid 6. Flow director 24 helps minimize any backflow of purge gas 18 to wafer 10. Optional flow director 24 can also act to direct purge gas 18 through dead space 26. In FIGS. 1-3, flow director 24 is essentially an annular wall. Such annular wall can be integrated into lid 6, body 4, or another part of chamber apparatus 2. Further, structures of other shapes can also be used as a flow director.

Figure 4:
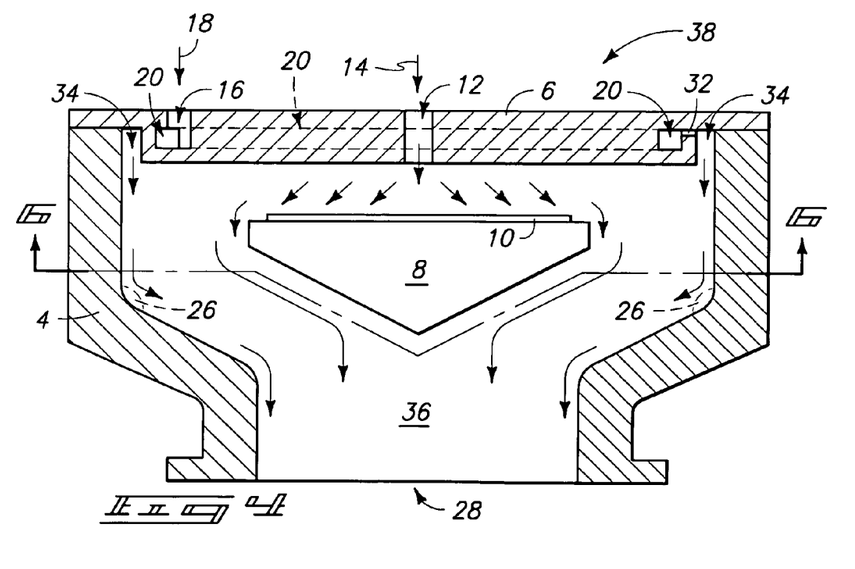
FIG. 4 shows a cross-sectional diagrammatic view of a deposition chamber portion according to another aspect of the invention.
Figure 5:
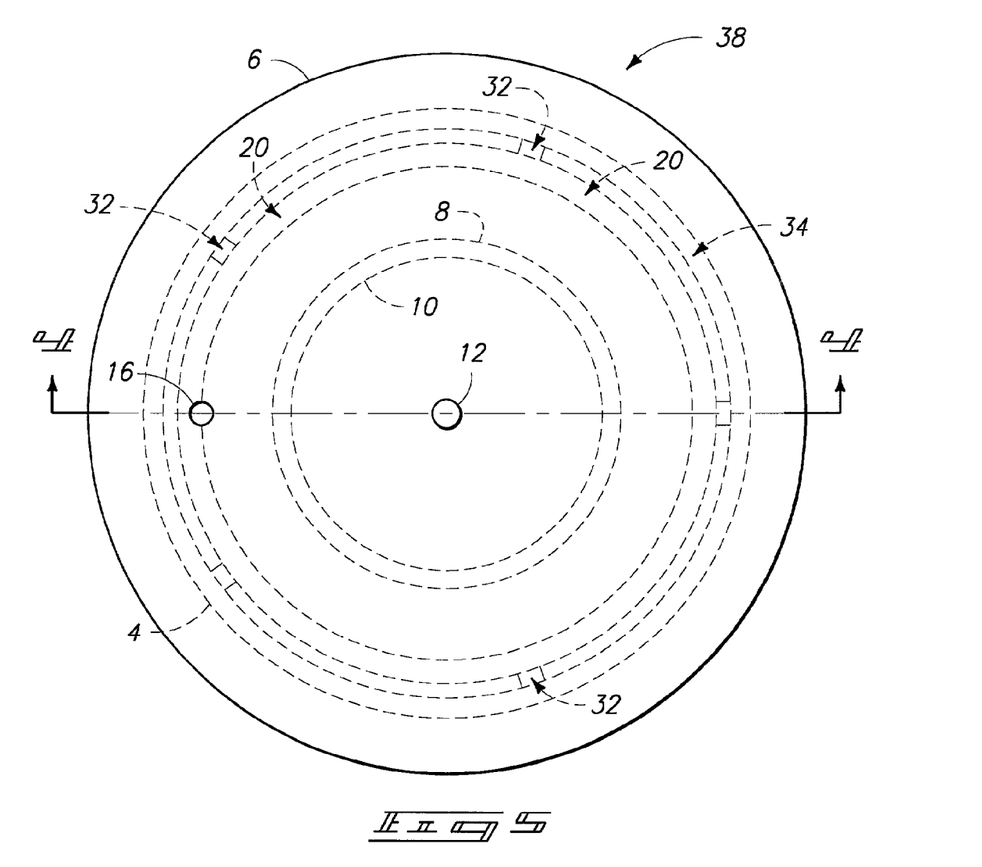
FIG. 5 shows a top view of the deposition chamber portion in FIG. 4.
Figure 6:
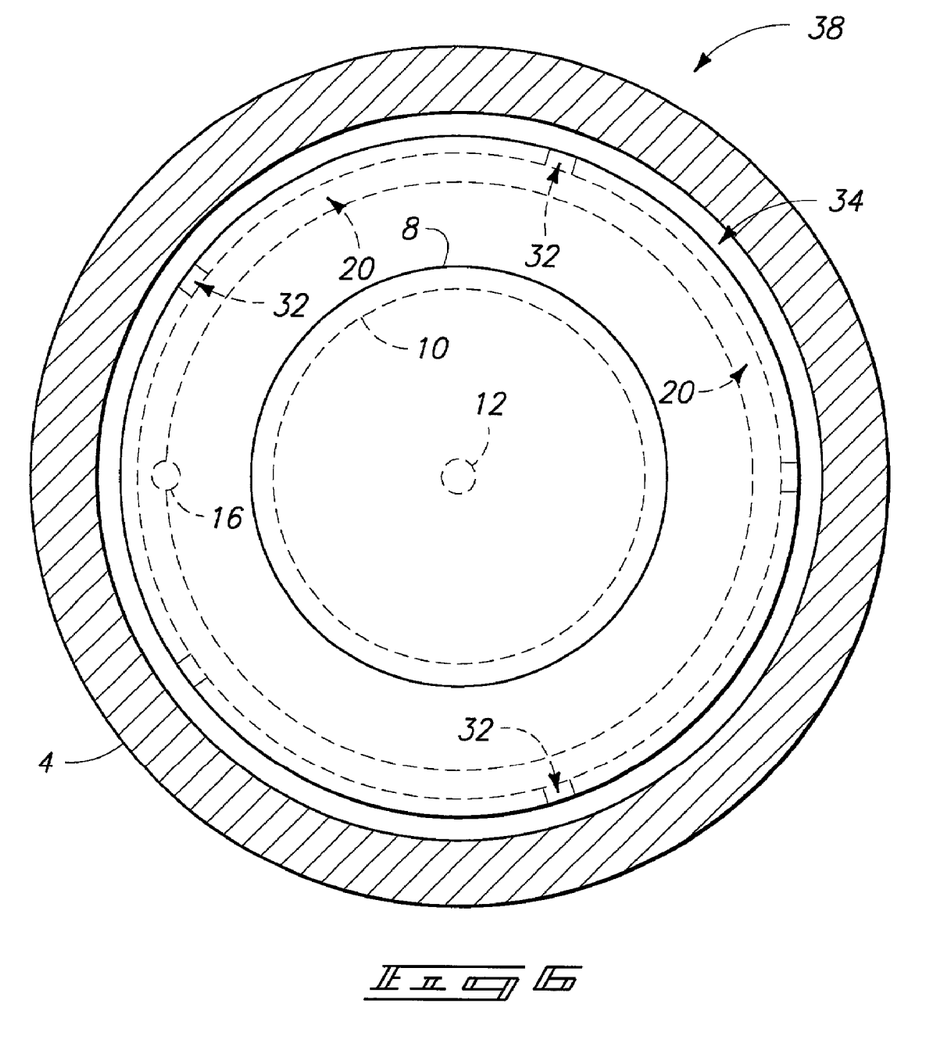
FIG. 6 shows a cross-sectional diagrammatic view of the deposition chamber portion in FIG. 1 taken along lines 6-6.

Turning to FIGS. 4-6, an alternative chamber apparatus 38 is shown substantially similar to chamber apparatus 2 of FIGS. 1-3 except that a different lid 30 is provided. Instead of purge exit ports 22, lid 30 includes a plurality of radial channel extensions 32 from purge channel 20 allowing purge gas 18 to flow outward to a single purge exit port 34. In FIGS. 4-6, purge exit port 34 is essentially formed by an annular gap between a portion of lid 30 and body 4 at an intersection of lid 30 and body 4 forming an interior corner of chamber apparatus 38. The multiple exits through channel extensions 32 into purge exit port 34 can thus form a purge curtain flowing along body 4 as shown in FIG. 4. As an alternative to lid 30, although not shown, purge exit port 34 could comprise multiple purge exit ports. Instead of a single annular gap between lid 30 and body 4, such gaps could be limited to a region proximate each channel extension 32. Accordingly, a separate purge exit port could be provided for each channel extension 32. In other regions not proximate a channel extension 32, lid 30 could extend sufficiently to seal with body 4.

Notably, chamber apparatus 38 is not shown as including an optional flow director. While a flow director could be provided therein, it is expected that the flow dynamics produced by positioning purge exit port 34 as indicated will also prevent backflow of purge gas 18 to wafer 10.

Also not shown in FIGS. 1-6 are the variety of dimensions and configurations for purge exit ports that can influence flow dynamics of purge gas 18. As an example, if channel extensions 32 are formed as wide, shallow slits, then a high volume, low pressure cascade of purge gas 18 can result. Modified channel extensions that are also shallow but comparably more narrow could produce a different flow regime, such as low volume, high pressure. Accordingly, given the principles of the present invention described herein, purge exit port 34, channel extensions 32, and/or purge exit ports 22 can be configured to provide a desirable flow regime for a particular deposition chamber apparatus. Once a particular space within a deposition chamber is chosen for one of the purging options described above, the purging apparatus can be configured to provide the desired purge at the desired location. It is further conceivable that multiple different apparatuses for injecting purge gas 18 into chamber 36 could be simultaneously provided. In this manner, multiple flow regimes could be produced in a single deposition chamber apparatus.

In keeping with the variety of possible features in a deposition chamber apparatus, the present inventions also encompass a variety of deposition methods. In one aspect, a deposition method includes injecting at least one deposition precursor into a deposition chamber including a lid having an outer surface outside the chamber and an inner chamber inside the chamber. While injecting the precursor, the method can include separately injecting a purge material through at least one purge passageway through the lid from the outer surface to the inner surface. The injected purge material can flow along at least a portion of the chamber walls. Such a deposition method can be a CVD method, such as ALD. The various purge and process chemical injection apparatuses described above can be used in such a method to produce the flow dynamics and advantages previously described. For example, the deposition method can further include forming a curtain from the injected purge material concentric to chamber walls, the curtain flowing axially with respect to the chamber. Forming the purge material curtain can include forming an annular curtain. Also, the injecting the purge material can occur at a first flow rate while injecting the precursor. The method can further include ceasing the precursor injection and substituting the precursor injection for additional purge material injection. Still further, while the precursor injection is ceased, the method can include adjusting the first flow rate to a second flow rate different from the first flow rate.

In a further aspect of the present invention, a deposition method can include injecting at least one deposition precursor into a deposition chamber wherein the precursor delivery occurs through at least one process chemical port in a lid of the chamber. The method can include ceasing delivery of the precursor and delivering purge material through at least one process chemical port. While delivering the purge material through the process chemical port, a purge material can be separately delivered through at least one purge port in the lid. The purge delivery through the purge port can occur along a part of the chamber walls. As an option, the purge material injection through the purge port can be stopped during the injecting the precursor through the process chemical port.

As a still further aspect of the invention, a chemical vapor deposition method can include injecting at least one purge material into a deposition chamber defined at least in part by chamber walls. A purge curtain can be formed from the injected purge material, the purge curtain extending downward from elevationally above a substrate holder and outside a lateral periphery of the substrate holder. The purge curtain can flow past the substrate holder. As an example, the purge curtain can extend from one of the chamber walls comprising a lid. The purge curtain can also be concentric to the substrate holder and flow axially with respect to the substrate holder. An annular purge curtain is one example. The method can further include injecting at least one process chemical into the chamber from elevationally above the substrate holder and inside a lateral periphery of the substrate holder. The process chemical can be delivered to a substrate received by the substrate holder.

Figure 7:
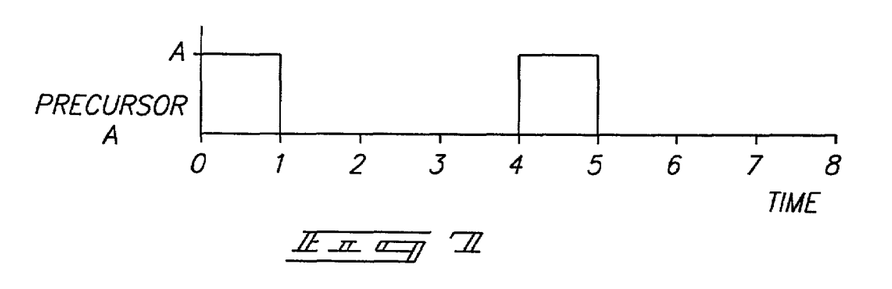
FIG. 7 is a line chart of precursor A flowrate with respect to time.

As can be understood from the descriptions above, various purge scenarios are encompassed by the aspects of the invention. A few examples of possible purge scenarios are described in FIGS. 9-13 as pertaining to FIGS. 7 and 8. Such figures exemplify an ALD process, however, the invention is not limited to ALD. FIG. 7 shows flow rate of precursor A with respect to time. Although the time intervals shown in the figures are equal, it is understood that purge times and pulse times can vary between processes and from cycle to cycle within a single process.

Figure 8:
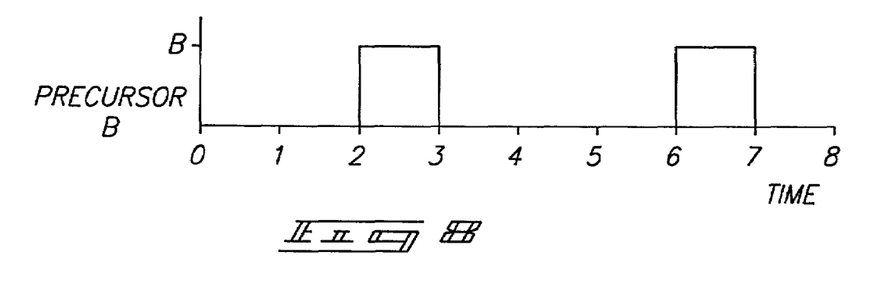
FIG. 8 is a line chart of precursor B flowrate with respect to time.
Figure 9:
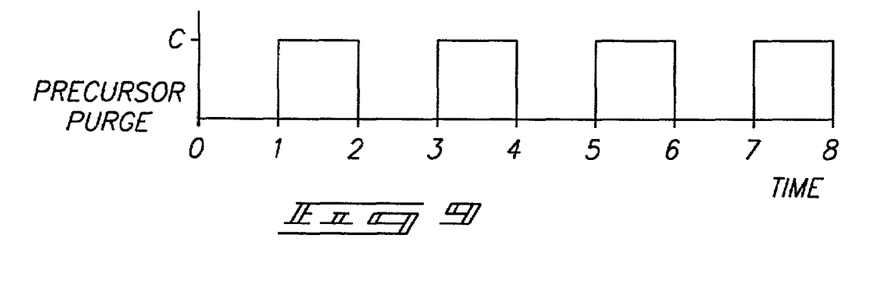
FIG. 9 is a line chart of precursor purge flowrate with respect to time.

Precursor A is shown in FIG. 7 injected at flow rate A from time 0 (T0) to time 1 (T1) and then stopped. A precursor purge is shown in FIG. 9 occurring at flow rate C from T1 to T2 to purge precursor A from process chemical inlets and the main space of the deposition chamber. Precursor B is then injected at flow rate B from T2 to T3, as shown in FIG. 8. Injection of precursor B is followed by precursor purge at flow rate C from T3 to T4. Accordingly, ALD of one monolayer occurs with completion of a first cycle at T4. FIGS. 7-9 show a second cycle occurring from T4 to T8.

Figure 10:
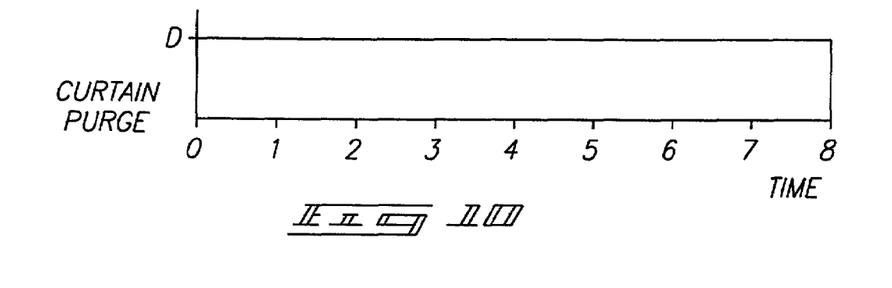
FIG. 10 is a line chart of curtain purge flowrate with respect to time according to one aspect of the invention.
Figure 11:
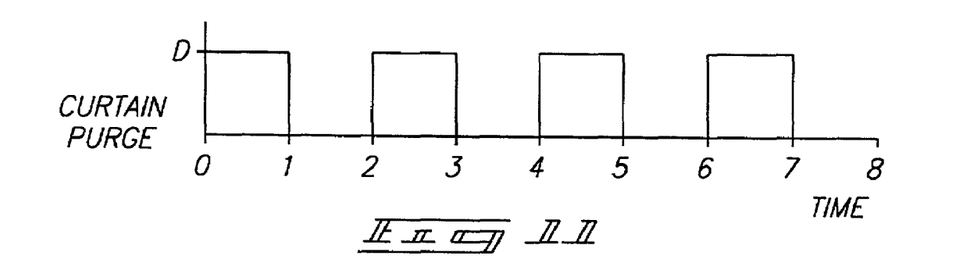
FIG. 11 is a line chart of curtain purge flowrate with respect to time according to an alternative aspect of the invention.
Figure 12:
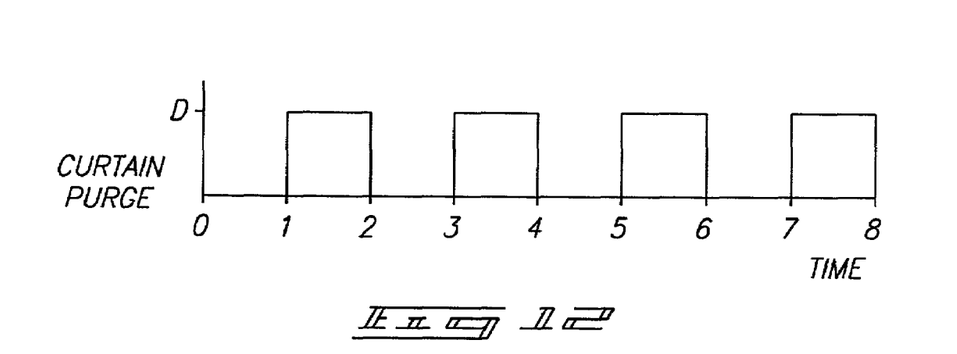
FIG. 12 is a line chart of curtain purge flowrate with respect to time according to another alternative aspect of the invention.
Figure 13:
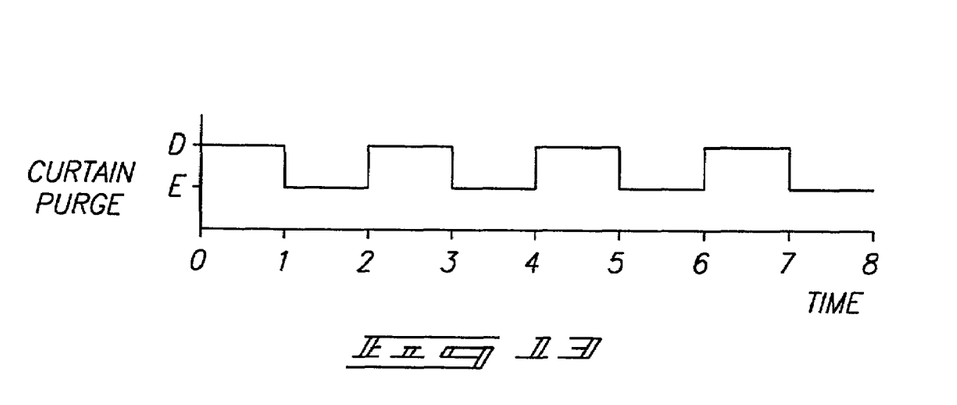
FIG. 13 is a line chart of curtain purge flowrate with respect to time according to a further alternative aspect of the invention.

FIGS. 10-13 show various alternatives in providing a curtain purge along with the ALD process exemplified by FIGS. 7-9. In FIG. 10, a curtain purge is provided at flowrate D continuously from T0 to T8. Accordingly, a curtain is provided during injection of each precursor as well as during precursor purge of the chamber. As a slight variation on this flow scenario, FIG. 13 shows curtain purge occurring at flowrate D during injection of precursors A and B, but decreasing to flowrate E during precursor purge. The flow scenario of FIG. 13 recognizes that, given the injection of precursor purge at flowrate C, curtain purge might be reduced. In a similar manner, FIG. 11 shows curtain purge occurring at flowrate D only during injection of precursors A and B and no curtain purge during precursor purge. Alternatively, FIG. 12 shows injection of curtain purge at flowrate D only during injection of precursor purge and not during injection of precursors A and B. In a circumstance where injection of curtain purge negatively impacts a deposition process, curtain purge can nevertheless be used to enhance removal of materials from a deposition chamber during precursor purge. Accordingly, the various benefits and advantages of the invention described herein can be obtained using aspects of the invention according to the above descriptions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method comprising:
   injecting a deposition precursor into a deposition chamber defined at least in part by chamber walls and comprising a substrate holder inside the chamber, a first of the chamber walls comprising a lid having an outer surface outside the chamber and an inner surface inside the chamber and a second of the chamber walls comprising a body;
   exposing a substrate on the substrate holder to the precursor and chemisorbing only one monolayer of precursor material on the substrate in the absence of another deposition precursor;
   while injecting the precursor and chemisorbing the monolayer, separately injecting a purge material at a first flow rate through at least one purge passageway through the lid from the outer surface to the inner surface and through a purge exit port into the chamber, the injected purge material flowing along at least a portion of the chamber walls, the purge exit port including one annular exit port, and the injecting the purge material through the purge passageway through the lid including injecting through an enclosed annular channel and through a plurality of enclosed radial channel extensions from the annular channel to the one annular exit port along radii of the annular channel;

separating the injected purge material from the substrate holder with a flow director provided inside the chamber and minimizing backflow of the injected purge material towards the substrate holder, the flow director extending downward from elevationally above the substrate holder to elevationally below a substrate on the substrate holder; and ceasing the precursor injection, substituting the precursor injection for additional purge material injection, and adjusting the first flow rate to a second flow rate different from the first flow rate.

2. The method of claim 1 wherein the injecting the purge material further comprises not delivering the purge material to a substrate received by the substrate holder.

3. The method of claim 1 further comprising forming a curtain from the injected purge material concentric to the second of the chamber walls, the curtain flowing axially with respect to the chamber.

4. The method of claim 1 further comprising forming an annular curtain from the injected purge material.

5. The method of claim 1 wherein the injecting purge material further comprises delivering the purge material through a dead space as to a precursor injected without the purge injection.

6. The method of claim 1, wherein the flow director is provided on the inner surface of the first of the chamber walls.

7. The method of claim 1 wherein the injecting the precursor further comprises injecting at least one process chemical into the chamber from elevationally above the substrate holder and inside a lateral periphery of the substrate holder.

8. The method of claim 7 wherein the injecting the precursor further comprises delivering the precursor to a substrate received by the substrate holder.

9. The method of claim 3, wherein the purge curtain flowing comprises flowing the injected purge material along the chamber walls, wherein the purge curtain is formed between a dead space and an injected precursor to prevent the precursor from migrating into the dead space.

10. The method of claim 1 wherein injecting the purge material at the first flow rate occurs at a pressure less than about 200 milliTorr and injecting the purge material at the second flow rate occurs at a pressure greater than about 500 milliTorr.

* * * * *